United States Patent
Shen et al.

(10) Patent No.: US 8,964,805 B2
(45) Date of Patent: Feb. 24, 2015

(54) THERMALLY OPTIMIZED MECHANICAL INTERFACE FOR HYBRID INTEGRATED WAVELENGTH DIVISION MULTIPLEXED ARRAYED TRANSMITTER

(75) Inventors: Xiao A. Shen, San Bruno, CA (US); Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 381 days.

(21) Appl. No.: 12/434,773

(22) Filed: May 4, 2009

(65) Prior Publication Data

US 2010/0232462 A1 Sep. 16, 2010

Related U.S. Application Data

(60) Provisional application No. 61/159,710, filed on Mar. 12, 2009.

(51) Int. Cl.
*H01S 3/04* (2006.01)
*G02B 6/12* (2006.01)
(Continued)

(52) U.S. Cl.
CPC ............. *G02B 6/12019* (2013.01); *G02B 6/42* (2013.01); *G02B 6/12026* (2013.01); *G02B 6/4201* (2013.01); *H01S 5/02248* (2013.01); *H01S 5/02252* (2013.01); *H01S 5/02272* (2013.01); *H01S 5/02284* (2013.01); *H01S 5/024* (2013.01); *H01S 5/02415* (2013.01);
(Continued)

(58) Field of Classification Search
CPC ............ H01S 5/02272; H01S 5/02276; H01S 5/0224; H01S 5/024; H01S 5/02407; H01S 5/02415; H01S 5/02453; H01S 5/02461; H01S 5/02476; H01S 5/026; H01S 5/40; H01S 5/4025; H01S 5/4031; G02B 6/4249
USPC ................. 372/34, 36, 50.12, 50.121, 50.122
See application file for complete search history.

(56) References Cited

U.S. PATENT DOCUMENTS 5,999,269 A * 12/1999 Haugsjaa et al. ............. 356/401
6,101,206 A   8/2000 Apollonov et al.
(Continued)

FOREIGN PATENT DOCUMENTS

CN         1564403 A    1/2005
EP         833419 A1    1/1998
(Continued)

OTHER PUBLICATIONS

Hashimoto, Toshikazu, et al., "Multichip Optical Hybrid Integration Technique with Planar Lightwave Circuit Platform," Journal of Lightwave Technology, vol. 16, No. 7, Jul. 1998, pp. 1249-1258.
(Continued)

*Primary Examiner* — Julio J Maldonado
*Assistant Examiner* — Joshua King
(74) *Attorney, Agent, or Firm* — Conley Rose, P.C.; Grant Rodolph; Jonathan K. Polk (57) ABSTRACT

An apparatus comprising a plurality of laser dice and a heat sink positioned between the laser dice and thermally coupled to the laser dice. Also included is an apparatus comprising a chip comprising a laser core, a stopper at least partially defining a groove, wherein the stopper and the groove are positioned adjacent to the chip, and a heater located between the laser core and the groove.

25 Claims, 8 Drawing Sheets

(51) Int. Cl.

| | |
|---|---|
| *G02B 6/42* | (2006.01) |
| *H01S 5/022* | (2006.01) |
| *H01S 5/024* | (2006.01) |
| *H01S 5/026* | (2006.01) |
| *H01S 5/06* | (2006.01) |
| *H01S 5/40* | (2006.01) |

(52) U.S. Cl.
CPC ......... *H01S 5/02453* (2013.01); *H01S 5/0268* (2013.01); *H01S 5/0612* (2013.01); *H01S 5/4087* (2013.01)
USPC .......................................... 372/36; 372/50.12

(56) References Cited

U.S. PATENT DOCUMENTS

| | | | | |
|---|---|---|---|---|
| 6,164,836 | A * | 12/2000 | Yamada et al. | 385/88 |
| 6,363,095 | B1 | 3/2002 | Jones et al. | |
| 6,611,546 | B1 * | 8/2003 | Garnache et al. | 372/92 |
| 6,660,548 | B2 * | 12/2003 | Naydenkov et al. | 438/26 |
| 6,724,794 | B2 * | 4/2004 | Dudoff et al. | 372/50.21 |
| 6,727,519 | B1 * | 4/2004 | Wu | 257/81 |
| 6,757,499 | B1 * | 6/2004 | Aoki | 398/182 |
| 2003/0095736 | A1 * | 5/2003 | Kish et al. | 385/14 |
| 2006/0043262 | A1 * | 3/2006 | Akram | 250/208.1 |
| 2008/0093613 | A1 * | 4/2008 | Farnworth | 257/98 |

FOREIGN PATENT DOCUMENTS

| | | |
|---|---|---|
| EP | 954069 A2 | 3/1999 |
| WO | 2008073085 A2 | 6/2008 |

OTHER PUBLICATIONS

Henry, C.H., et al., "Glass Waveguides on Silicon for Hybrid Optical Packaging," Journal of Lightwave Technology, vol. 7, No. 10, Oct. 1989, pp. 1530-1539.

Kim, Duk-Jun, et al., "Thermal Characteristics of a Laser Diode Integrated on a Silica-Terraced PLC Platform," ETRI Journal, vol. 27, No. 3, Jun. 2005, pp. 337-340.

Mino, S., et al., "Planar Lightwave Circuit Platform with Coplanar Waveguide for Opto-Electronic Hybrid Integration," Journal of Lightwave Technology, vol. 13, No. 12, Dec. 1995, pp. 2320-2326.

Nagarajan, Radhakrishnan, et al., "Large-Scale Photonic Integrated Circuits," IEEE Journal of Selected Topics in Quantum Electronics, vol. 11, No. 1, Jan./Feb. 2005, pp. 50-65.

Foreign Communication From a Related Counterpart Application—International Search Report, PCT/CN2010/071009, Jun. 3, 2010, 4 pages.

* cited by examiner

THERMALLY OPTIMIZED MECHANICAL INTERFACE FOR HYBRID INTEGRATED WAVELENGTH DIVISION MULTIPLEXED ARRAYED TRANSMITTER

CROSS-REFERENCE TO RELATED APPLICATIONS

The present application claims priority to U.S. Provisional Patent Application No. 61/159,710 filed Mar. 12, 2009 by Xiao A. Shen, et al. and entitled "Thermally Optimized Mechanical Interface for Hybrid Integrated Dense Wave Division Multiplexed Arrayed Transmitter," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Several approaches have been considered to provide low-cost, high-performance, and high-density transmitters for Wavelength Division Multiplexing (WDM) applications. One approach is a "monolithic" approach, where a plurality of semiconductor lasers, modulators, and multiplexers (MUXs) are fabricated and packaged on a single chip to produce a WDM transmitter system. This approach can reduce the size and cost of WDM transmitter systems and increase port density. The temperature of the semiconductor lasers also can be controlled for proper operation by sharing a common cooler, which reduces power consumption. However, since the monolithic approach combines many optical components into one system, this approach has a typically low yield.

Another approach to provide WDM transmitter systems is the "hybrid" integration approach, where a plurality of laser dice may be integrated on a planar lightwave circuit (PLC) platform and coupled to a MUX to produce a WDM laser transmitter. The laser dice and the MUX may be separately fabricated using different suitable materials and then coupled together. The hybrid integration approach may provide similar advantages as the monolithic approach, reduce the quantity of integrated components, and improve yield.

Controlling the wavelength of individual lasers may be challenging using either approach. The laser dice of the WDM laser transmitter each may transmit light at a different wavelength, which may vary from the desired or design wavelength by some offset due to the fabrication process and ambient temperature. To rectify the offset of each laser, a plurality of heaters may be individually coupled to at least some of the laser dice and used to heat the lasers to thermally tune the wavelengths. However, due to the close proximity of the lasers, which may be less than one millimeter (mm), heating the individual lasers may result in undesired thermal crosstalk, e.g., heat transfer between adjacent lasers. Thermal crosstalk between the lasers may reduce the wavelength tuning window and introduce additional heat to the lasers, which may make it more difficult to thermally control the wavelengths. Thermal crosstalk also may require more complicated protection schemes against heating failures.

SUMMARY

In one embodiment, the disclosure includes an apparatus comprising a plurality of laser dice and a heat sink positioned between the laser dice and thermally coupled to the laser dice.

In another embodiment, the disclosure includes an apparatus comprising a chip comprising a laser core, a stopper at least partially defining a groove, wherein the stopper and the groove are positioned adjacent to the chip, and a heater located between the laser core and the groove.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a system and apparatus for eliminating or substantially reducing thermal crosstalk between the lasers of a WDM laser transmitter. The apparatus may comprise a plurality of laser dice that may be coupled to an arrayed waveguide grating (AWG). The laser dice may comprise a plurality of laser cores, which may be located on a chip and coupled to a plurality of corresponding heaters. The laser cores may be separated from each other by a heat sink comprising solder located between the laser cores. The solder also may bond the chip to a substrate, which may be coupled to a base that comprises a cooler. In addition, the heat sink may thermally couple the laser dice to the cooler and prevent thermal crosstalk between laser cores. A plurality of stoppers may separate the chip from the substrate and the heat sinks from each other. Each stopper may define a groove, which may limit or prevent direct heat transfer between the heaters and the cooler. Accordingly, a substantial portion of the heat may flow in the direction from the heater to the laser core to the heat sink and then to the cooler. The components of the WDM laser transmitter, such as the stopper and the heat sink, may be fabricated out of typical materials using the hybrid integration process.

Figure 1:
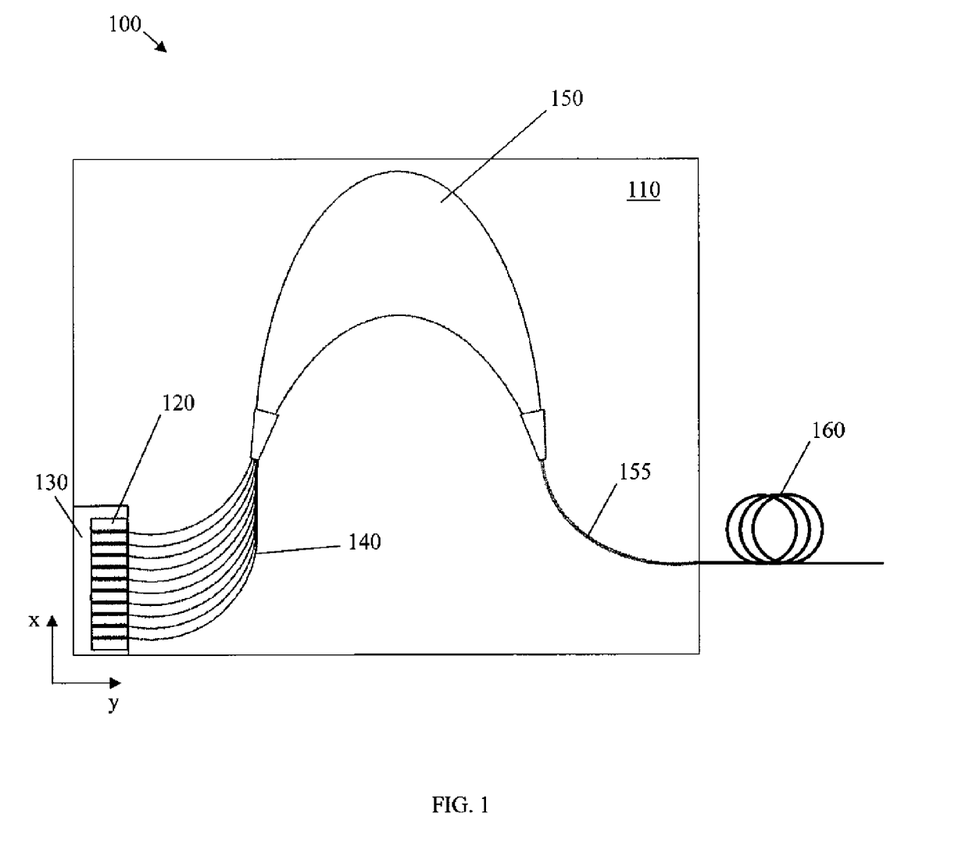
FIG. 1 is a top plan view of an embodiment of a WDM laser transmitter.

FIG. 1 illustrates one embodiment of a WDM laser transmitter 100. The WDM laser transmitter 100 may comprise a platform 110, a plurality of laser dice 120, a step 130, a plurality of first channels 140, an AWG 150, and optionally a second channel 155. The WDM laser transmitter 100 also may comprise or may be coupled to a fiber 160. These components may be configured according to known configurations, such as the hybrid integration configuration described herein. The WDM laser transmitter 100 may emit a plurality of distinct wavelength channels, such as the dense WDM (DWDM) channels described in the International Telecommunication Union Telecommunication Standardization Sector (ITU-T) standard G.694.1 and/or the coarse WDM (CWDM) channels described in the ITU-T G.694.2. As such, the WDM laser transmitter 100 may be suitable for use in backbone and/or access optical networks.

In an embodiment, the platform 110 may be configured to accommodate and integrate the components of the WDM laser transmitter 100. Specifically, the platform 110 may be a PLC platform, which may comprise at least one material that integrates, bonds, and/or supports the components of the WDM laser transmitter 100. The platform 110 may be produced using a deposition process, for instance on a chip or substrate. Further, the platform 110 may comprise a plurality of layers at different areas, which may be produced using deposition and/or etching. The layers may bind together other components of the WDM transmitter 100, such as the first channels 140, the AWG 150, and the second channel 155. Additionally, the layers may mount or support a component of the WDM laser transmitter 100, such as the laser dice 120. In an embodiment, the platform 110 may comprise a thin film layer of a dielectric material, such as Silica or Silicon Oxide ($SiO_2$), which may be deposited on a substrate using chemical deposition, such as chemical solution deposition (CSD), chemical vapor deposition (CVD), and Plasma enhanced CVD (PECVD). Alternatively, the film layer may be deposited using physical deposition, such as thermal evaporation, sputtering, pulsed laser deposition, or cathodic arc deposition (arc-PVD). Other deposition processes also may be used, including reactive sputtering, molecular beam epitaxy (MBE), or topotaxy. The thin film layer also may be etched at some regions of the platform 110 using wet etching or plasma etching. The thin film layer may have a thickness less than one mm, such as about ten micrometers.

The laser dice 120 may be the light emitting components in the WDM laser transmitter 100. The laser dice 120 may be coupled to the platform 110 and comprise a plurality of integrated semiconductor lasers, which may be configured in an array configuration. For instance, an array of semiconductor lasers may be produced by depositing a lasing material, such as Indium Phosphide (InP) or Gallium Arsenide (GaAs), at a plurality of aligned areas on a chip. Alternatively, the lasing material may be added to the chip using chemical or electrochemical doping. The laser dice 120 may be laser diodes, heterostructure lasers, quantum well lasers, quantum cascade lasers, distributed feedback (DFB) lasers, or combinations thereof. The laser dice 120 may be configured to transmit a plurality of light waves substantially in the same direction, e.g., from the same side of the array. The laser dice 120 also may be configured to transmit the light waves at a plurality of wavelengths that expand a total bandwidth. In an embodiment, the wavelengths may be spaced by about the same value, where the difference between the values of any two wavelengths may be about the same. In an embodiment, the laser dice 120 may be coupled to the platform 110 via bonding, as described herein.

In an embodiment, the laser dice 120 may be accommodated by the step 130 and the platform 110. For instance, the step 130 may be positioned at one edge of the platform 110 and coupled to the laser dice 120. The step 130 may comprise a layer of the platform 110, which may be produced via etching or deposition, and as such may comprise the same material as the platform 110, e.g. $SiO_2$. The step 130 also may be coupled to external electrical components, which may be used to operate and/or modulate the WDM laser transmitter 100, as described below.

The light emitted from the laser dice 120 may be transported to other components of the WDM laser transmitter 100 via the first channels 140. As such, the first channels 140 may be coupled to the laser dice 120 and the AWG 150 and may be aligned with the laser dice 120. The first channels 140 may comprise a plurality of waveguides, which may be configured to transfer the light from the laser dice 120 to the AWG 150. The waveguides may be dielectric waveguides, which may comprise a dielectric material that have a higher permittivity or dielectric constant than the surrounding platform 110. For example, the first channels 140 may be produced by depositing a layer of higher index material on the platform 110, etching the surrounding areas, and then depositing the same material as the platform 110 until the deposited material forms the upper cladding. Such a process produces the same cladding material all around the channels 140. Thus, the light waves may be guided through the channels 140 by total internal reflection from the laser dice 120 to the AWG 150.

The light waves transported by the first channels 140 may be combined into a single light wave at the AWG 150, and hence transmitted from the WDM laser transmitter 100. Accordingly, the AWG 150 may be coupled to the first channels 140 and the second channel 155. The AWG 150 may be an optical MUX configured to multiplex or combine a plurality of light waves from the first channels 140 into a combined light wave that propagates in the second channel 155. For instance, the AWG 150 may comprise a plurality of grating waveguides, which may have different lengths, where each two adjacent grating waveguides may have about the same length difference. The light waves may correspond to the individual semiconductor lasers in the laser dice 120, where each light wave may have a different wavelength. The light waves may propagate through the grating waveguides, undergo a change of phase due to the length difference between the adjacent grating waveguides, and constructively interfere into the combined light wave at an output of the AWG 150. Hence, the combined light wave may comprise all the wavelengths of the individual light waves. The grating waveguides may be dielectric gratings waveguides, which may comprise the same material as the first channels 140, and may be produced using a process similar to the process used to produce the first channels 140.

The combined light may be transmitted from the WDM laser transmitter 100 using the second channel 155 and the fiber 160. The second channel 155 may comprise a dielectric waveguide, similar to the first channels 140. The second channel 155 may be coupled to the AWG 150 and the fiber 160, and as such may guide the combined light from the AWG 150 to the fiber 160. The second channel 155 may be produced using a process similar to the process used to produce the first channels 140. In an embodiment, the first channels 140, the AWG 150, and the second channel 155 may be positioned in the same layer of the platform 110 and may be aligned with the laser dice 120.

In an embodiment, the fiber 160 may be an optical fiber, which may be used to transport the combined light wave from the WDM laser transmitter 100 to an optical system, such as an optical telecommunications system or an optical network. Specifically, the fiber 160 may be used to transport WDM signals, such as the CWDM and DWDM signals described above. The fiber 160 may be a standard single mode fibers (SMFs) as defined in ITU-T standard 6.652, dispersion shifted SMF as defined in ITU-T standard G.653, cut-off shifted SMF as defined in ITU-T standard G.654, non-zero dispersion shifted SMF as defined in ITU-T standard G.655, wideband non-zero dispersion shifted SMF as defined in ITU-T standard G.656, etc. All of the standards described herein are incorporated herein by reference.

Figure 2:
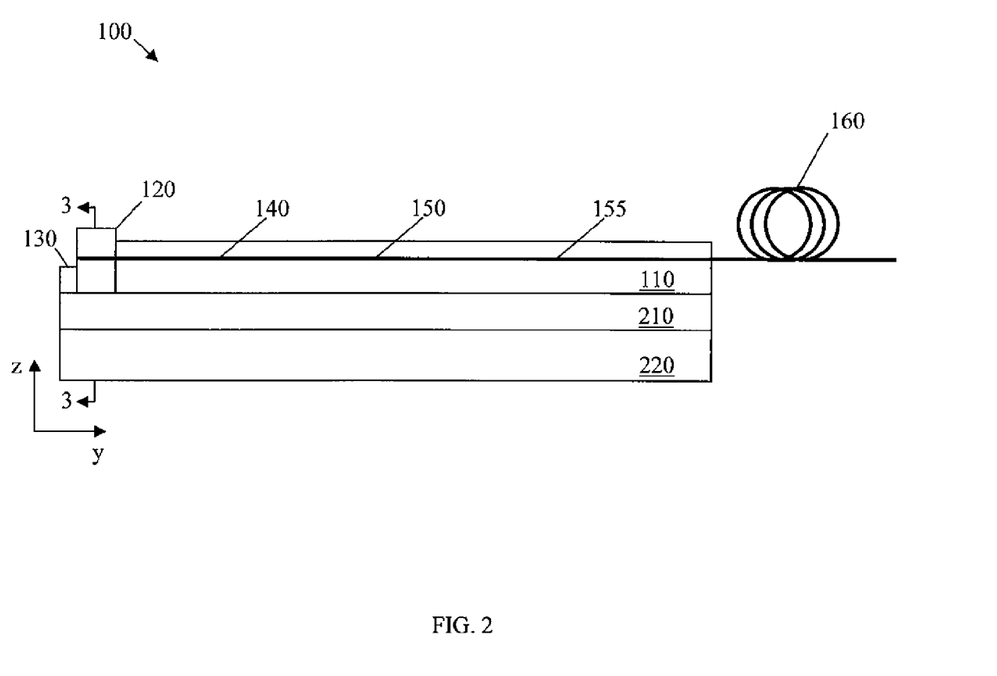
FIG. 2 is a side elevation view of an embodiment of the WDM laser transmitter.

FIG. 2 illustrates a side view of the WDM transmitter 100. As described above, the WDM laser transmitter 100 may comprise the platform 110, the laser dice 120, the step 130, the first channels 140, the AWG 150, the second channel 155, and the fiber 160. Additionally, the WDM laser transmitter 100 may comprise a substrate 210 and a base 220. The substrate 210 may be a semiconductor chip, such as a Silicon (Si) substrate used in the fabrication of integrated circuit and microelectronics. For instance, the substrate 210 may comprise substantially pure and defect free crystalline material, e.g., crystalline Si. The substrate 210 may be produced using a crystal growth process, sliced using a diamond coated blade, and then polished. The substrate 210 may be tabular, rectangular, or disk shaped. For example, the substrate 210 may have a length, width, or diameter from about one inch to about 12 inches, and may have a thickness less than about one mm and greater than about 100 micrometers ($\mu m$).

The base 220 may be configured to cool other components of the WDM laser transmitter 100. The base 220 may be coupled to the substrate 210 on the opposite side from the platform 110. The base 220 may comprise a thermoelectric cooler (TEC), such as a solid-state material, configured to transfer heat from one side to the other side. For instance, the TEC may transfer heat from the substrate 210 and the platform 110, which may have a first temperature, to the other side of the TEC, which may be exposed to air and have a second temperature lower than the first temperature. As such, the base 220 may be sufficiently cold so as to cool any component of the WDM laser transmitter 100, such as the laser dice 120 and maintain such at suitable operation conditions, e.g., at about 20 degrees Celsius (° C.). In an embodiment, the platform 110, the laser dice 120, the step 130, the substrate 210, and/or the base 220 may be integrated together.

Figure 3:
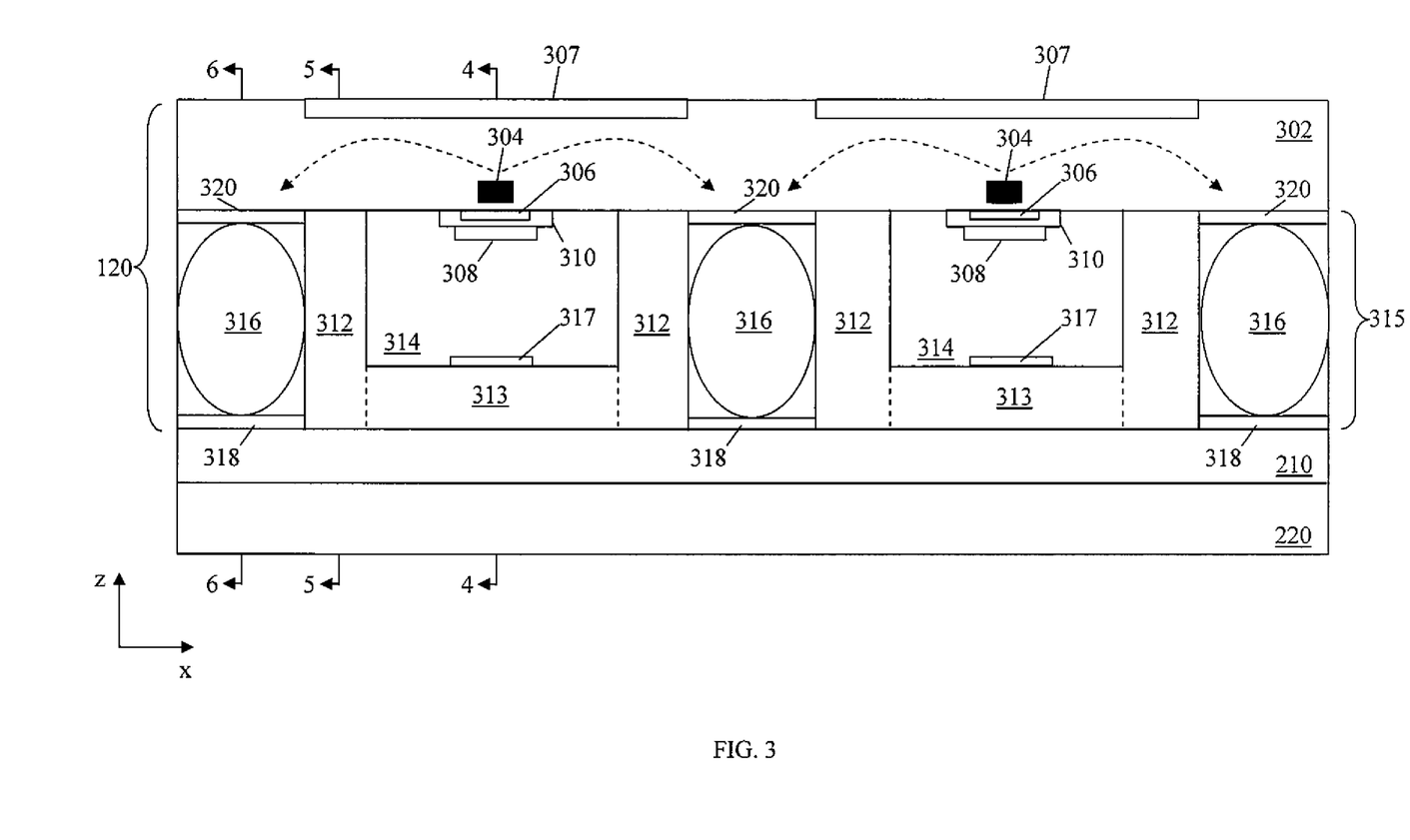
FIG. 3 is a section view of an embodiment of the WDM laser transmitter.

FIG. 3 illustrates a section view across line 3-3 in FIG. 2. As such, FIG. 3 shows the orientation of the laser dice 120, the substrate 210, and the base 220. The laser dice 120 may comprise a chip 302, which may be coupled to or comprise a plurality of laser cores 304 and a plurality of electrodes 306, grounds 307, heaters 308, and electric insulators 310 associated with at least some of the laser cores 304. Additionally, the chip 302 may be adjacent to a plurality of stoppers 312 and coupled to a plurality of heat sinks 315.

The chip 302 may be configured to accommodate some of the components of the laser dice 120. The chip 302 may comprise a solid state material, which emits light via doping, such as InP or GaAs, and may have properties similar to the substrate 210. In an embodiment, the chip 302 may comprise the laser cores 304, which may comprise regions of the chip 302 that are doped to emit light. Alternatively, the laser cores 304 that comprise the doped material, and possibly other layers, may be deposited on the chip 302. The laser cores 304 also may be embedded in or covered by a second layer, which may be deposited on the chip 302 and may comprise similar material. To produce an array of light transmitters, the laser cores 304 may be spaced from one other at about the same distance, e.g., less than about one mm, and coupled to or aligned with the first channels 140. The laser cores 304 primarily may emit light in the direction along the length of the first channels and across the chip 302 and the substrate 210.

The electrodes 306 and the associated grounds 307 may be used to modulate light emissions from the laser dice 120. For instance, the electrodes 306 and grounds 307 may comprise an electric conductor material, such as gold, copper, or aluminum, and may be positioned in proximity of the corresponding laser cores 304. The electrodes 306 may be separated from the laser cores 304 by a relatively thin layer of material, e.g., on the order of one $\mu m$, similar to the chip 302. The grounds 307 may be configured similar to the electrodes 306 and may be positioned on the opposite side of the chip 302. Each ground 307 may be aligned with one laser core 304, or a single ground 307 may be positioned across the chip 302. In an embodiment, the WDM laser transmitter 100 may be a directly modulated laser (DML), where the electrodes 306 may be coupled to an alternating current (AC) source, which may be used to electrically modulate the electrodes 306 at a selected frequency, for instance using a modulated current signal. The electrodes 306 may be electrically modulated at Gigabits per second (Gbps), for example, at a frequency greater than or equal to 10 Gbps. Modulating the electrodes 306 may optically modulate the laser cores 304 (in the laser dice 120), since the proximity between the electrodes 306 and the laser cores 304 may allow current transfer between them, which may cause biasing and light emission from the laser cores 304.

The wavelengths of the light emitted from the laser cores 304 may be further controlled using the heaters 308. The heaters 308 may comprise an electrically resistive, heat generating material, such as Titanium Tungsten (TiW), and may be positioned in proximity of the corresponding laser cores 304. Additionally, the heaters 308 may be separated from the electrodes 306 by the electric insulators 310. The heaters 308 may be coupled to electric sources, which may be controlled to individually heat the laser cores 304 at different temperatures. The temperature of the laser cores 304 affects the laser wavelength emitted therefrom, and hence the heaters 308 may be used to separately adjust the corresponding light wavelengths emitted from the laser cores 304. In an embodiment, the distance between the heaters 308 and the laser cores 304 may be no more than about one millimeter, such as about twenty $\mu m$.

The laser dice 120 also may comprise the electric insulators 310, which may comprise an electric insulating or dielectric material, such as $SiO_2$ or Silicon Nitride (SiN). The electric insulators 310 may be positioned between the electrodes 306 and the heaters 308 to prevent or limit electric coupling (or current transfer) between the modulated electrodes 306 and the heaters 308. As such, the electric insulators 310 may improve current transfer and modulation speed between the electrodes 306 and the laser cores 304. The electric insulators 310 may inhibit heat transfer between the heaters 308 and the laser cores 304. Specifically, the electric insulators 310 may act as thermal resistors, and thus increasing the thickness of the electric insulators 310 may reduce the heat transfer efficiency between the heaters 308 and the laser cores 310 and affect the control efficiency of the laser cores 304. Therefore, the material and thickness of the electric insulators 310 may be selected to optimize both the prevention of current transfer between the electrodes 306 and the heaters 308, and the promotion of heat transfer between the heaters 308 and the laser cores 304. As such, the electric insulators 310 preferably comprise any material that has high thermal conductivity (good heat transfer properties), as well as high current resistance (good electric insulation properties). For example, the electric insulators may be $SiO_2$ with a thickness less than or equal to about one millimeter, such as two μm.

The stoppers 312 may be any component configured to separate the heaters 308 from the substrate 210. Specifically, the stoppers 312 may comprise a dielectric material, such as $SiO_2$, may be positioned between the chip 302 and the substrate 210, and as such may provide structural separation between the chip 302 and the substrate 210. The stoppers 312 may be positioned between the heaters 308 and the heat sinks 315. In an embodiment, a layer of the dielectric material may be deposited on the substrate 210 and then etched to produce the stoppers 312. Alternatively, a layer of the platform 110 may be etched to produce the stoppers 312. Further, the stoppers 312 may be vertically sized such that they align the laser cores 304 with the first channels 140 when the chip 302, the stoppers 312, and the substrate 210 contact each other. In addition, the chip 302 and/or the substrate 210 may comprise a plurality of alignment markers thereby providing horizontal alignment of the laser cores 304 with the platform 110.

A plurality of pads 313 may optionally be positioned between or be part of the stoppers 312, e.g. under the heater 308 and adjacent to the substrate 210. The pads 313 may comprise a thermally insulating material, such as $SiO_2$ ($SiO_2$ has a thermal conductivity equal to about 1.38 watt per meter degree Kelvin (W/m.K)). A plurality of RF traces 317 may be positioned on the pads 317. The RF traces 317 and the electrodes 306 may each comprise an extension that extends to the left or right of the position shown in FIG. 3, e.g. such that the heaters 308 and electrical insulators 310 are not positioned between the extensions of the RF traces 317 and the electrodes 306. In such an embodiment, the RF traces 317 and the electrodes 306 may be coupled together via their extensions using solder, e.g. solder bumps or wire bonds (not shown).

In an alternative embodiment, the heaters 308 may be positioned on the pads 313 instead of on the chip 302. In such an embodiment, the heaters 308 may be covered by the electric insulators 310, and the RF traces 317 deposited on top of the electric insulators 310. Such a configuration allows the top of the RF traces 317 and the bottom of the electrodes 306 to be exposed. As such, the RF traces 317 and the electrodes 306 may be coupled together using solder, e.g. solder bumps or wire bonds (not shown). In such an embodiment, the thickness of the pads 313 may be configured to position the RF traces 317 in close proximity to the electrodes 306, which may also position the heaters 308 in close proximity to the laser cores 304. Such a configuration promotes the flip-chip fabrication method described herein.

The stoppers 312 and optionally the pads 313 may define a plurality of grooves 314. The grooves 314 may surround the heaters 308 and be adjacent to the chip 302. The grooves 314 may comprise a material that has a lower thermal conductivity than the chip 302 and the heat sink 315. For instance, the groove 314 may comprise air, which may have a thermal conductivity equal to about 0.02 W/m.K. As such, the groove 314 may prevent or substantially limit direct heat transfer between the heaters 308 and the substrate 210 via pads 313. Consequently, the heating efficiency of the heaters 308 for the laser cores 304 and hence thermal wavelength control of the laser cores 304 may be improved.

A heat sink 315 may be located between each pair of laser cores 304. The heat sinks 315 may comprise solder 316, such as a metal or alloy (e.g., tin, lead, copper, zinc, silver, etc.), and may attach the chip 302 to the substrate 210, for instance in a flip-chip configuration. The heat sinks 315 also may comprise a bottom seed layer 318 and a top seed layer 320. The bottom seed layer 318 and the top seed layer 320 may comprise different metals than the solder 316, which may improve the bonding between the solder 316, the chip 302, and the substrate 210. The heat sinks 315 may serve as a heat conducting path from the chip 302 to the substrate 210 for the lasers 302, for example because the solder 316 may have a higher thermal conductivity than the chip 302. For example, the solder 316 may have a thermal conductivity equal to about 60 W/m.K. As such the heat sinks 315 may provide heat transfer from the chip 302 to the substrate 210, and prevent thermal crosstalk between the laser cores 304.

The heat sinks 315 may be equally spaced across the laser dice 120 and may be separated by the stoppers 312 and optionally the pads 313. Specifically, the heat sinks 315 may be positioned about midway between the laser cores 304 to provide a maximum distance between each heat sink 315 and the adjacent laser cores 304. For example, the distance between the heat sink 315 and the adjacent laser core 304 may be from about 100 μm to about one millimeter or from about 200 μm to about 500 μm. By placing the heat sinks 315 about midway between the laser cores 304, e.g. instead of coupling the heat sink 315 to the laser cores 304, the heat sink 315 may intercept the heat flow in the chip 302 between the adjacent laser cores 304 and conduct the heat to the substrate 210, where the heat may be dissipated by the cooler in the base 220. Such a configuration may further limit additional heat transfer to the laser cores 304 from sources besides the heat from the heaters 308, such as thermal crosstalk between the adjacent laser cores 304 and lead to better wavelength control of the laser cores 304.

Figure 4:
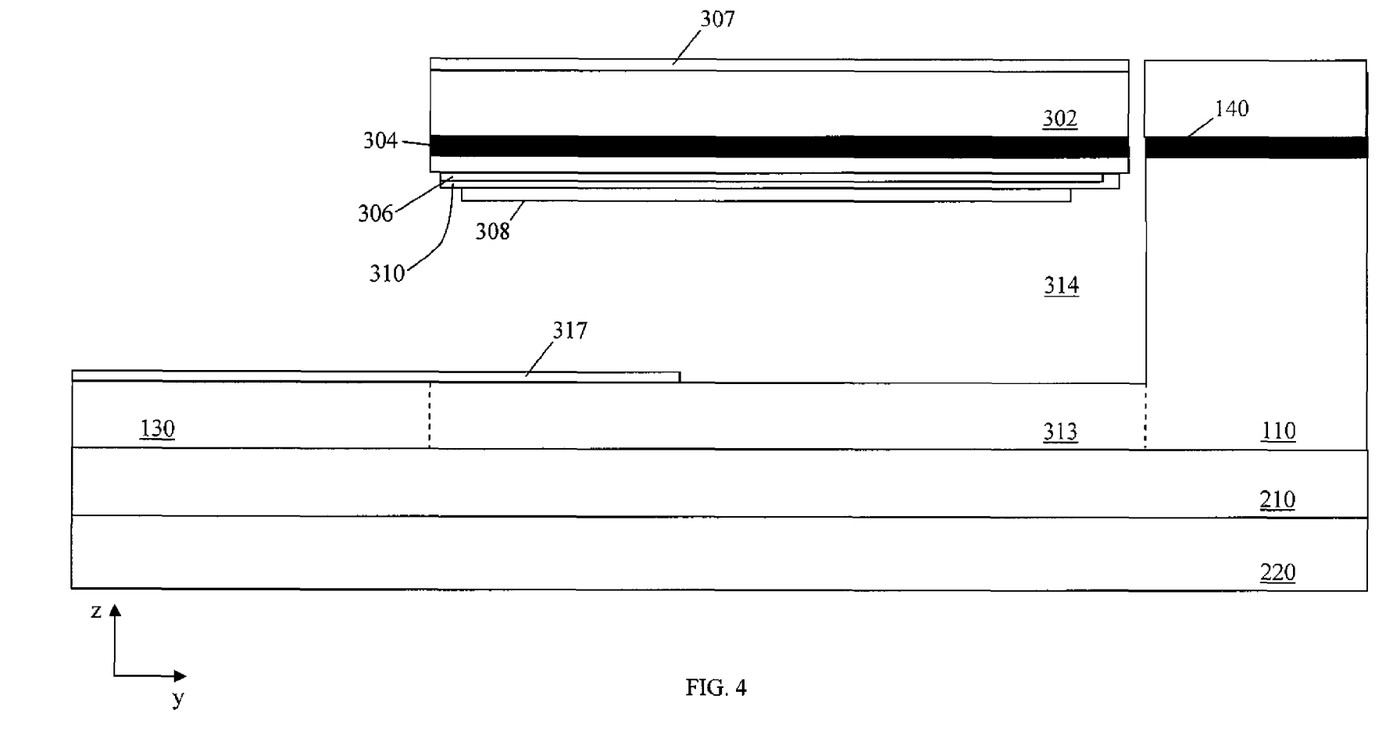
FIG. 4 is another section view of an embodiment of the WDM laser transmitter.

FIG. 4 illustrates a section view across a line 4-4 of FIG. 3. FIG. 4 shows the orientation of the platform 110, the step 130, the substrate 210, the base 220, the chip 302, the laser core 304, the electrode 306, the ground 307, the heater 308, the electric insulator 310, the optional pad 313, and the RF trace 317, which may extend onto the step 130. The electrode 306 may be electrically coupled to the RF trace 317 using solder or a wire bond (not shown). The RF trace 317 may be coupled to an external AC source, which may be used to apply a modulated electric signal at a certain frequency and therefore modulate the electrode 306 and hence the laser core 304.

Figure 5:
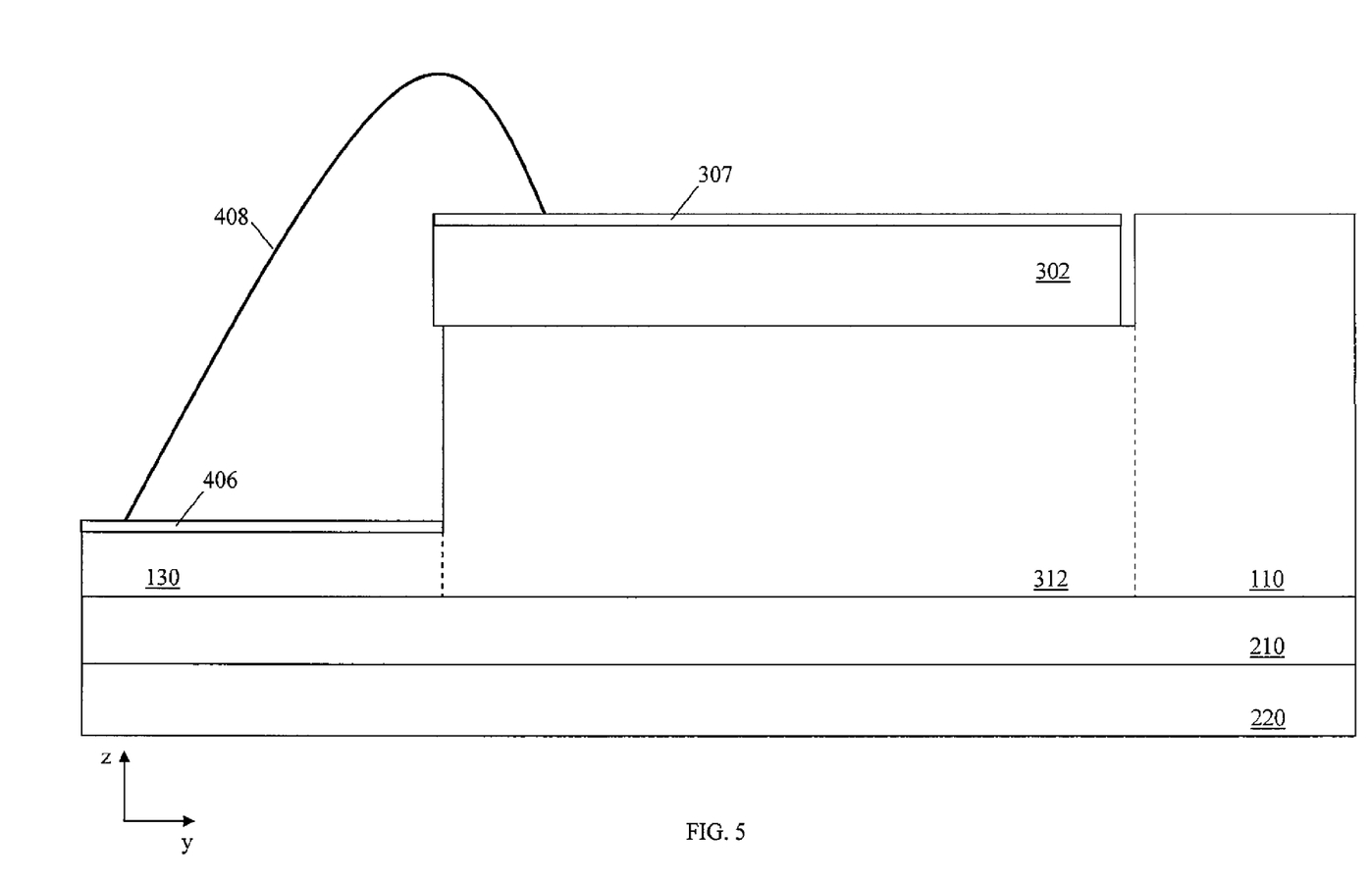
FIG. 5 is another section view of an embodiment of the WDM laser transmitter.

FIG. 5 illustrates a section view across line 5-5 of FIG. 3. FIG. 5 shows the orientation of the platform 110, the step 130, the substrate 210, the base 220, the chip 302, the ground 307, and the stopper 312. As shown, the stopper 312 may separate the chip 302 from the substrate 210 and vertically align the chip 302 with the platform 110. Additionally, an RF ground 406 may be positioned on the step 130, e.g. at alternating locations between the RF traces 317, and may comprise an electric conductor. The RF ground 406 may be coupled to the ground 307 via a wire bond 408. The RF ground 406 may also be coupled to an external ground.

Figure 6:
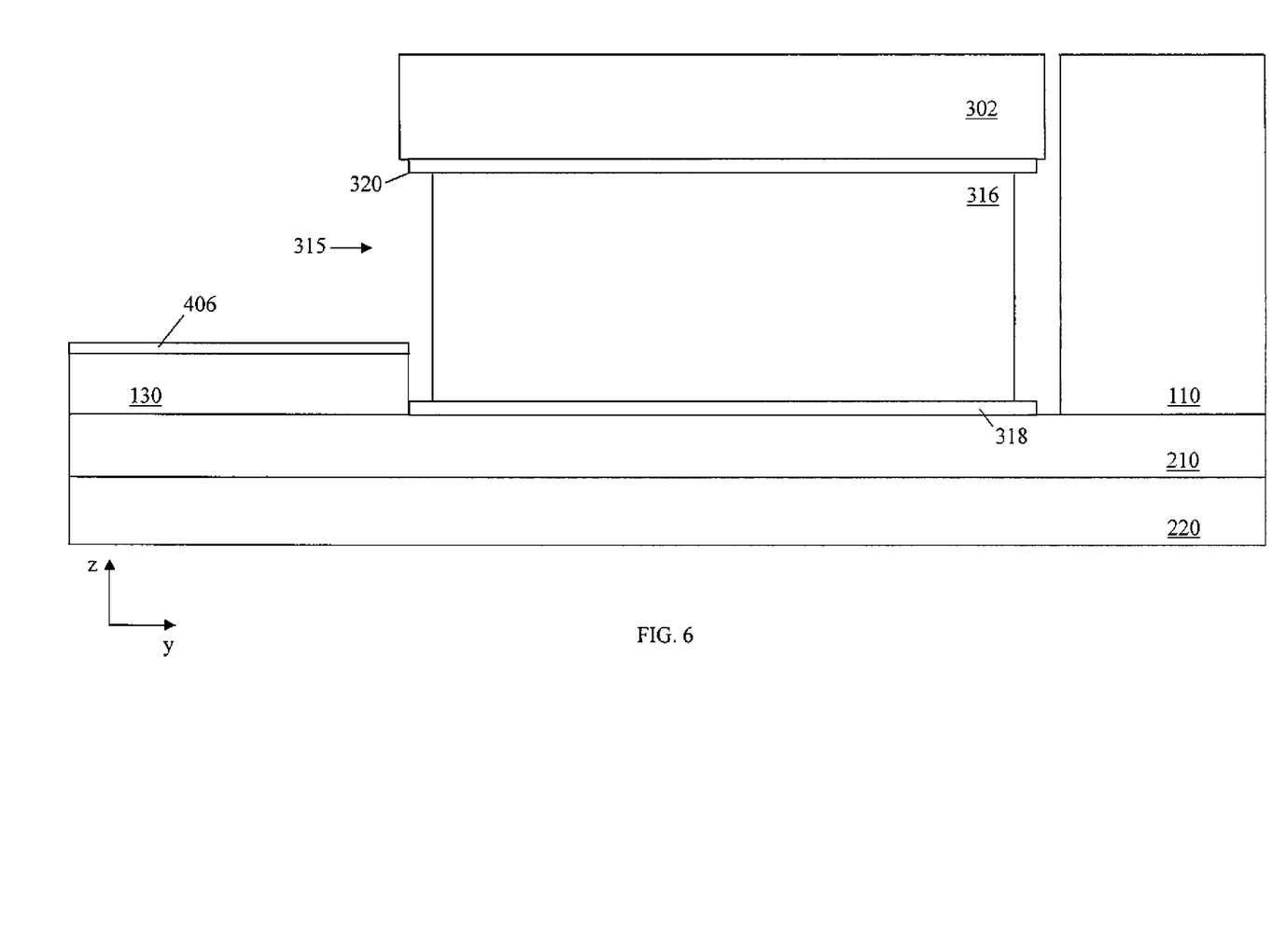
FIG. 6 is another section view of an embodiment of the WDM laser transmitter.

FIG. 6 illustrates a section view across the line 6-6 of FIG. 3. FIG. 6 shows the orientation of the platform 110, the step 130, the substrate 210, the base 220, the chip 302, the RF ground 406, and the heat sink 315 comprising the solder 316, the bottom seed layer 318, and the top seed layer 320. In some embodiments, the thickness of the bottom seed layer 318 and/or the top seed layer 320 may be increased to improve thermal conductivity of the heat sink 315.

Figure 7:
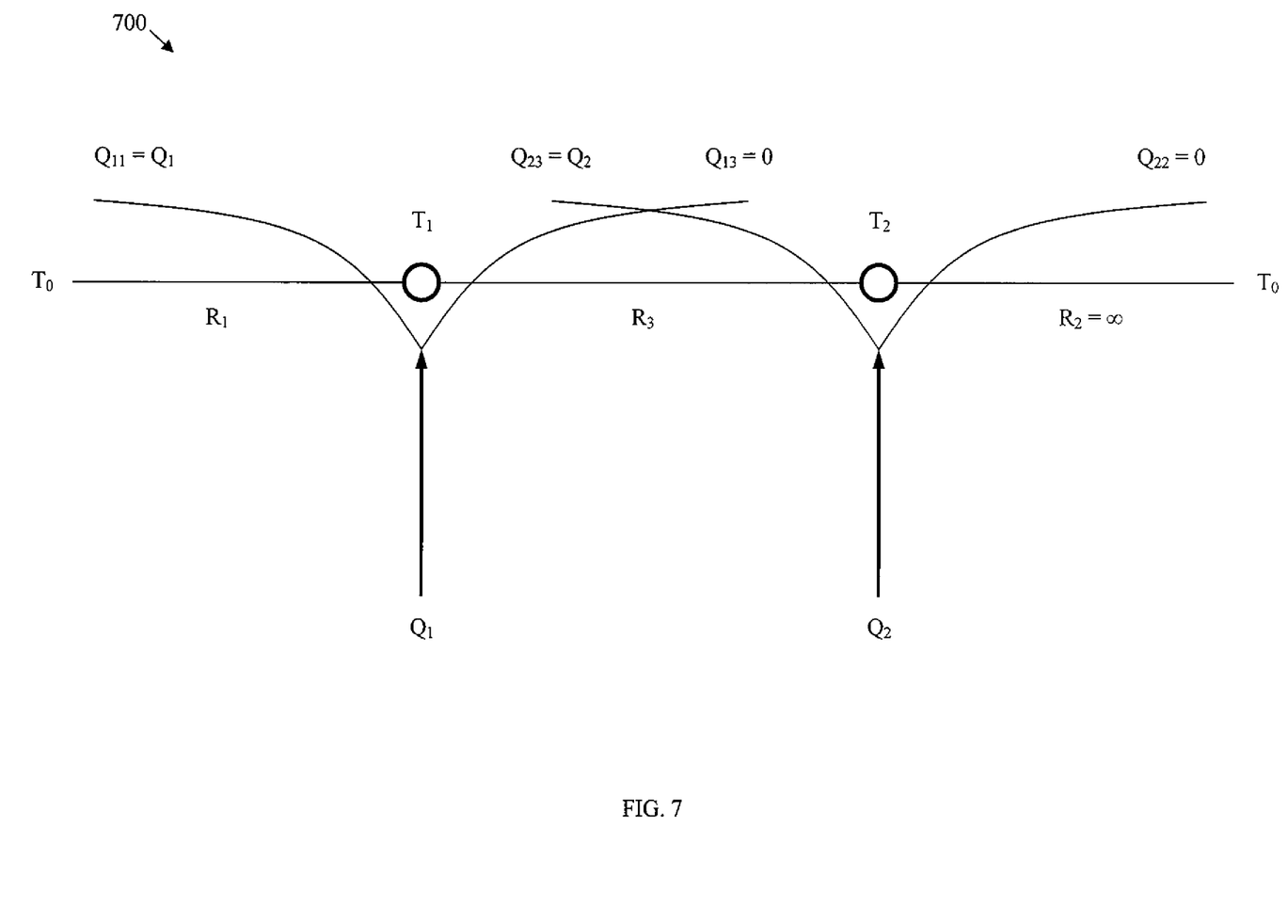
FIG. 7 is a schematic view of an embodiment of heat flow in the WDM laser transmitter.

FIG. 7 illustrates a one dimensional heat transfer diagram 700 approximately describing the heat flow in the WDM laser transmitter. In the WDM laser transmitter, the heater may add heat $Q_2$ to the system and may have temperature $T_2$. Similarly, the laser may add heat $Q_1$ to the system and may have temperature $T_1$. Additionally, the WDM laser transmitter may comprise a cooler, which may remove heat from the system and may have a temperature $T_0$. Moreover, $R_1$ may be the thermal resistance between the laser and the cooler via the heat sinks 315, $R_3$ may be the thermal resistance between the laser and the heater, and $R_2$ may be the thermal resistance between the heater and the cooler via air and pads 313. $R_2$ may be substantially larger than $R_3$ and $R_1$, and as such may act as an infinitely large thermal insulator. Hence, the heat flow $Q_{22}$ from the heater to the cooler may be equal to about zero or negligible. Further, $T_2$ may be greater than $T_1$, and thus the heat flow $Q_{13}$ from the laser core to the heater may be zero. As such, the heat flow $Q_{23}$ from the heater to the laser core may be equal to about $Q_2$. The path between the laser core and the cooler (e.g., the chip, heat sink, and substrate), may have a thermal resistance $R_1$ that is relatively smaller compared with $R_2$ and perhaps $R_3$. Hence, the heat flow $Q_{11}$ from the laser core to the cooler may be equal to about the heat flow $Q_1$ from the laser core. Thus, the heat sink and the stoppers described above may substantially create heat transfer in one direction from the heater, to the adjacent laser, to the two adjacent heat sinks, to the substrate, and then to the cooler, without substantial thermal crosstalk or direct heat transfer between lasers.

Figure 8:
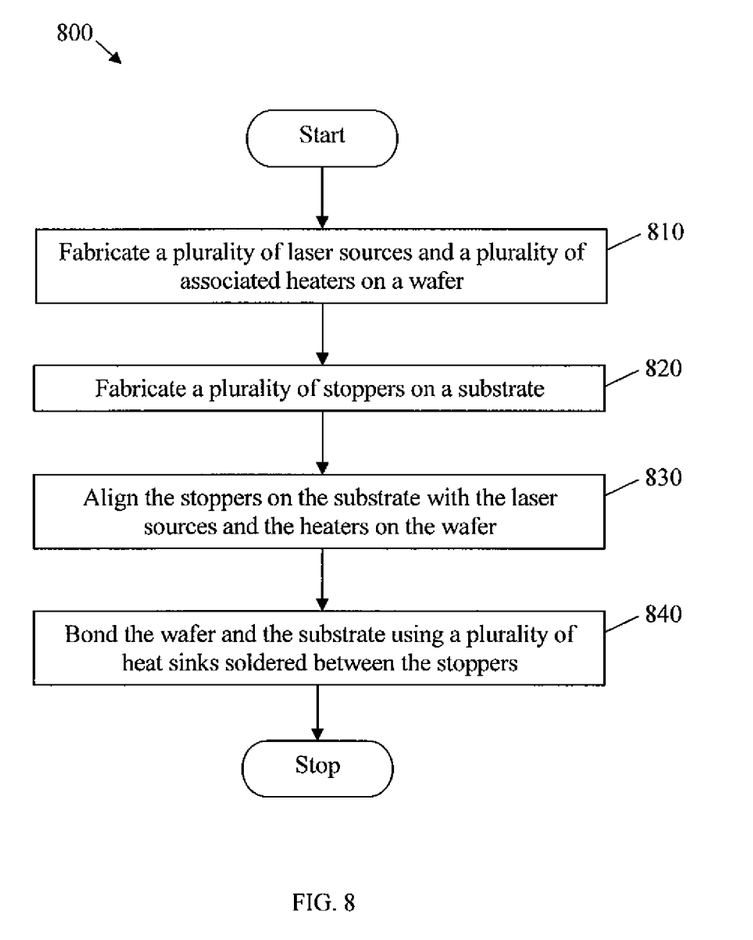
FIG. 8 is a flowchart of an embodiment of a WDM laser transmitter fabrication method.

FIG. 8 illustrates one embodiment of a WDM laser transmitter fabrication method 800, which may be used to produce a WDM laser transmitter, such as the WDM laser transmitter 100 described herein. At block 810, a plurality of laser sources and a plurality of associated heaters may be fabricated on a chip. For example, the laser cores and the heaters may be created by depositing, doping, and/or etching an InP or GaAs chip in an array configuration. The electric insulators and the electrodes also may be fabricated with the laser cores and the heaters on the chip.

At block 820, a plurality of stoppers may be fabricated, e.g., via deposition and/or etching, on a substrate, such as a Si substrate, and the optional pads may be created between the stoppers. A plurality of electrodes comprising the aforementioned extensions may also be created on the pads. In some embodiments, the pads may be thicker than shown in the figures, and/or the heaters may be deposited on the pads instead of the chip. In such a case, the heaters may be covered by the electric insulators and the electrodes. The thickness of the pads may be adjusted to position the heaters in proximity of the leaser cores, and the electrodes may be soldered to the chip, for instance via a flip-chip bonding process. The substrate may be bonded to a cooler, such as a TEC, at any stage of the WDM laser transmitter fabrication method 800.

At block 830, the stoppers on the substrate may be aligned with the laser sources and the heaters on the chip, for instance as part of the flip-chip process using semiconductor fabrication alignment tools. At block 840, the chip and the substrate may be bonded using solder, e.g. a plurality of solder bumps. Solder bumps may also be used to bond the RF traces on the pads with the electrodes on the chip. Further necessary fabrication procedures may be implemented before, after, or between the procedures above to complete the WDM laser transmitter fabrication method 800 and produce the WDM laser transmitter, such as the fabrication of an AWG component, the integration of the waveguides, and the alignment of further components.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:
1. An apparatus comprising:
a chip comprising:
a first plane defined by a bottom major surface on the chip; and a plurality of light-emitting laser cores comprising a first laser core and a second laser core, wherein there is no air gap or thermal insulation directly between the laser cores;

an electrode electrically coupled to the first laser core;

a substrate having a second plane defined by a top major surface on the substrate, wherein the first plane and the second plane are substantially parallel;

a heat sink positioned between the first laser core and the second laser core, wherein the heat sink is thermally coupled to the first laser core and the second laser core and bonds the substrate and the chip, and wherein the electrode does not contact the heat sink; and a plurality of stoppers comprising a first stopper and a second stopper, wherein the first stopper is positioned on a first side of the heat sink and the second stopper is positioned on a second side of the heat sink, wherein at least part of the first stopper is positioned between the first laser core and the heat sink, and wherein at least part of the second stopper is positioned between the second laser core and the heat sink.

2. The apparatus of claim 1, wherein the heat sink is positioned about midway between the first laser core and the second laser core, wherein a first thermal conductivity from the first laser core through the heat sink and to the substrate is greater than a second thermal conductivity from the first laser core to the second laser core, and wherein the heat sink does not bond to the chip at the electrode.

3. The apparatus of claim 1, wherein at least part of the first stopper is positioned between the electrode and the heat sink, and wherein a top major surface on the chip and a bottom major surface on the chip are substantially flat.

4. The apparatus of claim 1, further comprising a cooler thermally coupled to the heat sink, wherein the substrate is positioned directly between the cooler and the heat sink, wherein the electrode does not contact the substrate.

5. The apparatus of claim 4, wherein the heat sink is not positioned directly between any of the laser cores and the cooler.

6. The apparatus of claim 4, further comprising a heater thermally coupled to the first laser core, wherein the substrate comprises a silicon substrate, and wherein the stoppers comprise a dielectric material.

7. The apparatus of claim 6, wherein the heater is deposited onto a pad coupled to the cooler, and wherein the pad and the first stopper are configured to prevent thermal transfer from the heater to the substrate, but not thermal transfer from the heater to the chip.

8. The apparatus of claim 6, further comprising an electric insulator positioned directly between the heater and the first laser core.

9. The apparatus of claim 8, wherein the electrode is positioned directly between the electric insulator and the first laser core.

10. The apparatus of claim 4, further comprising an arrayed waveguide grating (AWG) optically coupled to the laser cores, wherein the stoppers are positioned between the first plane and the second plane, and wherein the stoppers are sized to align the laser cores with the AWG.

11. An apparatus comprising:

a chip comprising:

a plurality of electrodes; and a plurality of laser cores comprising a first laser core and a second laser core, wherein there is no air gap or thermal insulation directly between the laser cores;

a plurality of stoppers comprising a first stopper and a second stopper, wherein the first stopper and the second stopper each at least partially define a groove, wherein the stoppers and the grooves are positioned adjacent to the chip;

a substrate, wherein the stoppers separate the chip from the substrate; and a heat sink directly connected to the chip and the substrate and configured to bond the chip with the substrate, wherein at least part of the first stopper is positioned between the first laser core and the heat sink, and wherein at least part of the second stopper is positioned between the second laser core and the heat sink.

12. The apparatus of claim 11, further comprising a heater located between the first laser core and a first groove, wherein at least part of the first stopper is positioned directly between the heater and the heat sink, and wherein the first stopper is not integral with the substrate.

13. The apparatus of claim 12, wherein the heat sink thermally couples the chip to a cooler, wherein the cooler is coupled to the substrate such that the substrate is positioned between the chip and the cooler, and wherein the heat sink bonds the substrate to the chip.

14. The apparatus of claim 12, wherein the heater is no more than about 20 micrometers (μm) from the first laser core, and wherein the heat sink is from about 100 μm to about 1 millimeter (mm) from the first laser core and the second laser core.

15. The apparatus of claim 12, wherein a first thermal conductivity of the grooves is about 0.02 watt per meter Kelvin (W/m·K), a second thermal conductivity of the stoppers is about 1 W/m·K, and a third thermal conductivity of the heat sink is about 60 W/m·K.

16. The apparatus of claim 11, wherein the chip is coupled to the substrate in a flip-chip configuration.

17. The apparatus of claim 11 further comprising heaters located between the laser cores and the grooves, wherein the grooves comprise air.

18. The apparatus of claim 3, wherein the top major surface of the substrate and a bottom major surface of the substrate are substantially flat.

19. The apparatus of claim 11, wherein the chip has a bottom major surface and a top major surface that are substantially planar, wherein the substrate has a plane that is defined by a largest surface on the substrate, wherein the plane is substantially parallel to the bottom major surface and the top major surface and wherein the heat sink is not directly connected to any of the electrodes.

20. The apparatus of claim 11, wherein the first stopper and the second stopper are positioned substantially perpendicular to a first plane defined by a largest surface on the chip and a second plane defined by a largest surface on the substrate, wherein the grooves separate the laser cores from the substrate, and wherein a first groove is positioned directly between the first stopper and a third stopper.

21. The apparatus of claim 6, wherein the heater is positioned between the chip and the substrate.

22. The apparatus of claim 6, wherein the heater is positioned between the chip and the cooler.

23. The apparatus of claim 11, wherein the grooves comprise silicon dioxide.

24. An apparatus configured to use a thermally conducting region to reduce the thermal crosstalk between a plurality of laser cores configured to emit light, the apparatus comprising:

a substrate that is substantially planar;

a chip having a length and a width that define a major surface of the chip, wherein the major surface of the chip is substantially parallel with both the substrate and a direction of light emitted from the laser core, and wherein the chip comprises:

a chip substrate;

a plurality of electrodes; and a plurality of laser cores comprising a first laser core and a second laser core, wherein the laser cores are affixed to the chip substrate such that there is no air gap or thermal insulation directly between the laser cores and the chip substrate;

a thermal conducting region comprising a heat sink configured to bond the chip substrate with the substrate, wherein the thermal conducting region is positioned directly between the chip substrate and the substrate, but neither directly between the first laser core and the substrate nor directly between the second laser core and the substrate, and wherein the heat sink does not contact any of the electrodes; and a plurality of thermally isolating regions positioned directly between the laser cores and the substrate, wherein the thermally isolating regions comprise:

a plurality of grooves comprising a first groove; and a plurality of stoppers comprising a first stopper and a second stopper and coupled to the substrate, wherein the first stopper is positioned on a first side of the heat sink and the second stopper is positioned on a second side of the heat sink, wherein at least part of the first stopper is located between the heat sink and the first groove, wherein the stoppers comprise silicon dioxide ($SiO_2$), and wherein the substrate comprises silicon (Si), but not $SiO_2$.

25. The apparatus of claim 24, wherein the chip further comprises a heater thermally coupled to the first laser core, and wherein the thermally isolating regions further comprise a pad coupled to the first such that the pad is located between the first groove and the substrate.

* * * * *

UNITED STATES PATENT AND TRADEMARK OFFICE
CERTIFICATE OF CORRECTION

| | | |
|---|---|---|
| PATENT NO. | : 8,964,805 B2 | Page 1 of 1 |
| APPLICATION NO. | : 12/434773 | |
| DATED | : February 24, 2015 | |
| INVENTOR(S) | : Xiao A. Shen and Yu Sheng Bai | |

It is certified that error appears in the above-identified patent and that said Letters Patent is hereby corrected as shown below:

In the Claims

Column 12, Line 39, Claim 18 should read:

The apparatus of claim 3, wherein the top major surface on the substrate and a bottom major surface on the substrate are substantially flat.

Column 14, Line 16, Claim 25 should read:

The apparatus of claim 24, wherein the chip further comprises a heater thermally coupled to the first laser core, and wherein the thermally isolating regions further comprise a pad coupled to the first groove such that the pad is located between the first groove and the substrate.

Signed and Sealed this
Fourteenth Day of July, 2015

Michelle K. Lee
*Director of the United States Patent and Trademark Office*